United States Patent
Cha (10) Patent No.: US 10,996,255 B2
(45) Date of Patent: May 4, 2021

(54) VOLTAGE-CHARACTERISTIC-BASED VEHICLE IDENTIFICATION NUMBER

(71) Applicant: FORD GLOBAL TECHNOLOGIES, LLC, Dearborn, MI (US)

(72) Inventor: Byungho Cha, Palo Alto, CA (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/364,787

(22) Filed: Mar. 26, 2019

(65) Prior Publication Data
US 2020/0309838 A1 Oct. 1, 2020

(51) Int. Cl.
| | | |
|---|---|---|
| G01R 19/25 | (2006.01) | |
| B60R 16/023 | (2006.01) | |
| G01R 31/00 | (2006.01) | |
| G07C 5/08 | (2006.01) | |
| H04L 12/40 | (2006.01) | |

(52) U.S. Cl.
CPC ........ G01R 31/007 (2013.01); B60R 16/0232 (2013.01); G01R 19/2509 (2013.01); G07C 5/085 (2013.01); H04L 12/40039 (2013.01); H04L 2012/40273 (2013.01)

(58) Field of Classification Search
None
See application file for complete search history.

(56) References Cited

U.S. PATENT DOCUMENTS

| | | | | |
|---|---|---|---|---|
| 6,601,002 | B1 * | 7/2003 | Ennis ...................... | H02H 7/266 702/60 |
| 6,845,313 | B2 * | 1/2005 | Hasegawa ................ | F02N 3/04 701/113 |
| 7,124,003 | B1 * | 10/2006 | West ..................... | G01R 31/007 701/32.8 |
| 8,103,256 | B2 * | 1/2012 | Gilmartin ........... | H04M 3/5166 455/414.1 |
| 8,433,471 | B2 * | 4/2013 | Christensen ........... | G06Q 30/06 701/29.1 |
| 9,283,857 | B2 * | 3/2016 | Shelton ................... | B60L 53/63 |
| 9,533,640 | B2 * | 1/2017 | Rai ......................... | H04L 67/12 |
| 9,598,822 | B2 * | 3/2017 | Mustard ................. | B61D 15/00 |
| 9,649,895 | B2 * | 5/2017 | McCormick ........ | B60C 23/0408 |

(Continued)

FOREIGN PATENT DOCUMENTS

WO 2018013171 A1 1/2018

OTHER PUBLICATIONS

Device Fingerprint. Retrieved from https://en.wikipedia.org/wiki/Device_fingerprint on Jan. 3, 2019.

*Primary Examiner* — Benyam Haile
*Assistant Examiner* — Muhammad Adnan
(74) *Attorney, Agent, or Firm* — Michael J. Spenner; Brooks Kushman P.C.

(57) ABSTRACT

A vehicle bus, of a vehicle, configured to provide data communication among a plurality of controllers of the vehicle. An identity controller is programmed to collect voltage samples over the vehicle bus from the plurality of controllers to create a voltage profile indicating consistent electrical aspects of the data communication between the controllers, the electrical aspects being independent of data content of the data communication, and generate a voltage fingerprint uniquely identifying the vehicle using the voltage profile.

16 Claims, 6 Drawing Sheets

(56) References Cited

U.S. PATENT DOCUMENTS

| | | | | |
|---|---|---|---|---|
| 10,009,325 B1* | 6/2018 | David | | H04L 9/0866 |
| 10,462,155 B2* | 10/2019 | Bathurst | | H04L 63/1416 |
| 2003/0182138 A1* | 9/2003 | Jeanneret | | G07C 5/008 |
| | | | | 705/305 |
| 2004/0003245 A1* | 1/2004 | Dabbish | | H04L 9/3263 |
| | | | | 713/168 |
| 2006/0208924 A1* | 9/2006 | Matalon | | G07B 15/063 |
| | | | | 340/933 |
| 2007/0219686 A1* | 9/2007 | Plante | | H04N 5/23229 |
| | | | | 701/33.4 |
| 2008/0147491 A1* | 6/2008 | Robinson | | G06Q 10/02 |
| | | | | 705/13 |
| 2008/0238361 A1* | 10/2008 | Pinnell | | H02J 7/00047 |
| | | | | 320/107 |
| 2008/0238678 A1* | 10/2008 | De Castro | | G07C 5/085 |
| | | | | 340/572.1 |
| 2010/0017122 A1* | 1/2010 | Chang | | G01C 21/3423 |
| | | | | 701/414 |
| 2012/0104844 A1* | 5/2012 | Koiso | | G08G 1/094 |
| | | | | 307/9.1 |
| 2012/0139489 A1* | 6/2012 | Gaul | | B60R 25/04 |
| | | | | 320/109 |
| 2013/0093384 A1* | 4/2013 | Nyu | | H02J 7/00 |
| | | | | 320/107 |
| 2013/0304276 A1* | 11/2013 | Flies | | G07C 5/085 |
| | | | | 701/1 |
| 2013/0318607 A1 | 11/2013 | Reed et al. | | |
| 2013/0328525 A1* | 12/2013 | Erger | | H02J 7/00 |
| | | | | 320/109 |
| 2016/0117866 A1* | 4/2016 | Stancato | | H04L 51/32 |
| | | | | 705/5 |
| 2017/0166217 A1* | 6/2017 | Sbianchi | | G06F 11/3089 |
| 2017/0286675 A1* | 10/2017 | Shin | | G06F 1/12 |
| 2017/0292983 A1* | 10/2017 | Wortberg | | G01R 31/007 |
| 2017/0318044 A1* | 11/2017 | Dagmi | | H04L 63/1425 |
| 2017/0345228 A1* | 11/2017 | Dibb | | G08G 1/017 |
| 2018/0248766 A1* | 8/2018 | Ezra | | H04L 67/12 |
| 2018/0270196 A1* | 9/2018 | Bathurst | | H04L 63/0209 |
| 2018/0354525 A1* | 12/2018 | Lindelof | | G07C 5/0808 |
| 2019/0206151 A1* | 7/2019 | Zucconelli | | G07C 5/08 |
| 2019/0259225 A1* | 8/2019 | Amendolagine | | G07C 5/085 |
| 2019/0346840 A1* | 11/2019 | Valeri | | E06B 11/02 |
| 2020/0015048 A1* | 1/2020 | Mendes | | B60L 53/665 |
| 2020/0198561 A1* | 6/2020 | Weed | | B60R 16/0238 |
| 2020/0377057 A1* | 12/2020 | Ahmed | | G06F 21/44 |

* cited by examiner

VOLTAGE-CHARACTERISTIC-BASED VEHICLE IDENTIFICATION NUMBER

TECHNICAL FIELD

Aspects of the disclosure generally relate to a vehicle identification number that is based on voltage signal characteristics of a plurality of controllers of a vehicle.

BACKGROUND

Connected and autonomous vehicles (or CAVs) may be connected to various cloud-based services. Applications currently executed by mobile devices may be adopted into CAVs directly or indirectly through wireless connectivity capabilities of the vehicles. In CAVs, remote vehicle identification may be useful to track vehicles, applications, and services in the infotainment and telematics. However, the connected environment of CAVs requires consideration of security and privacy issues of vehicle identifiers, similar to as is done for mobile device identification.

SUMMARY

In one or more illustrative examples, a vehicle bus, of a vehicle, configured to provide data communication among a plurality of controllers of the vehicle. The system also includes an identity controller programmed to collect voltage samples over the vehicle bus from the plurality of controllers to create a voltage profile indicating consistent electrical aspects of the data communication between the controllers, the electrical aspects being independent of data content of the data communication, and generate a voltage fingerprint uniquely identifying the vehicle using the voltage profile.

In one or more illustrative examples, a method includes receiving a test voltage fingerprint from a vehicle, the voltage fingerprint uniquely identifying the vehicle from electrical aspects of the data communication between a plurality of controllers of the vehicle independent of content of the data communication; comparing the test voltage fingerprint with stored voltage fingerprints to identify a match; if a match is found, indicate a positive identity result, and otherwise, indicate a negative identity result.

In one or more illustrative examples, a system includes a storage maintaining a plurality of voltage fingerprints, each voltage fingerprint uniquely identifying a different vehicle from electrical aspects of the data communication between a plurality of controllers of the respective vehicle independent of content of the data communication. The system also includes a processor programmed to receive a test voltage fingerprint from a test vehicle, compare the test voltage fingerprint with the stored plurality of voltage fingerprints to identify a match, and indicate an identity result responsive to whether a match for the test voltage fingerprint was found in the storage.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

A vehicle identification number, or VIN, generally refers to a 17-digit number format as defined by the National Highway Traffic Safety Administration (NHTSA). VINs have been assigned to every car and light truck model year 1981 or later. A vehicle can be tracked by using identifiers such as VIN. However, it may be inadvisable to use such identifying numbers directly, due to security and privacy issues. In this disclosure, a robust vehicle identification method is proposed for CAVs that does not involve the use of VINs or other readily-known vehicle identifiers. Instead, a vehicle identification is performed using vehicle physical signal characteristics.

Each electronic control unit (ECU) in the vehicle that is connected to a controller area network (CAN) of the vehicle has different electrical characteristics due to the variations in the layer of transistors and resistors inside the CAN controller. These characteristics may include voltages and clock skews along the CAN bus, but are irrelevant to the actual content of the data communications themselves. These characteristics of the ECUs may be measured and used to construct unique vehicle identifiers. For instance, voltages captured from CAN messages of multiple ECUs in the vehicle may be used to build a hardware vehicle fingerprint. Notably, as the fingerprint is based on physical factors, the fingerprint is independent from the software state and survives a hard reset of the vehicle electronics.

Figure 1A:
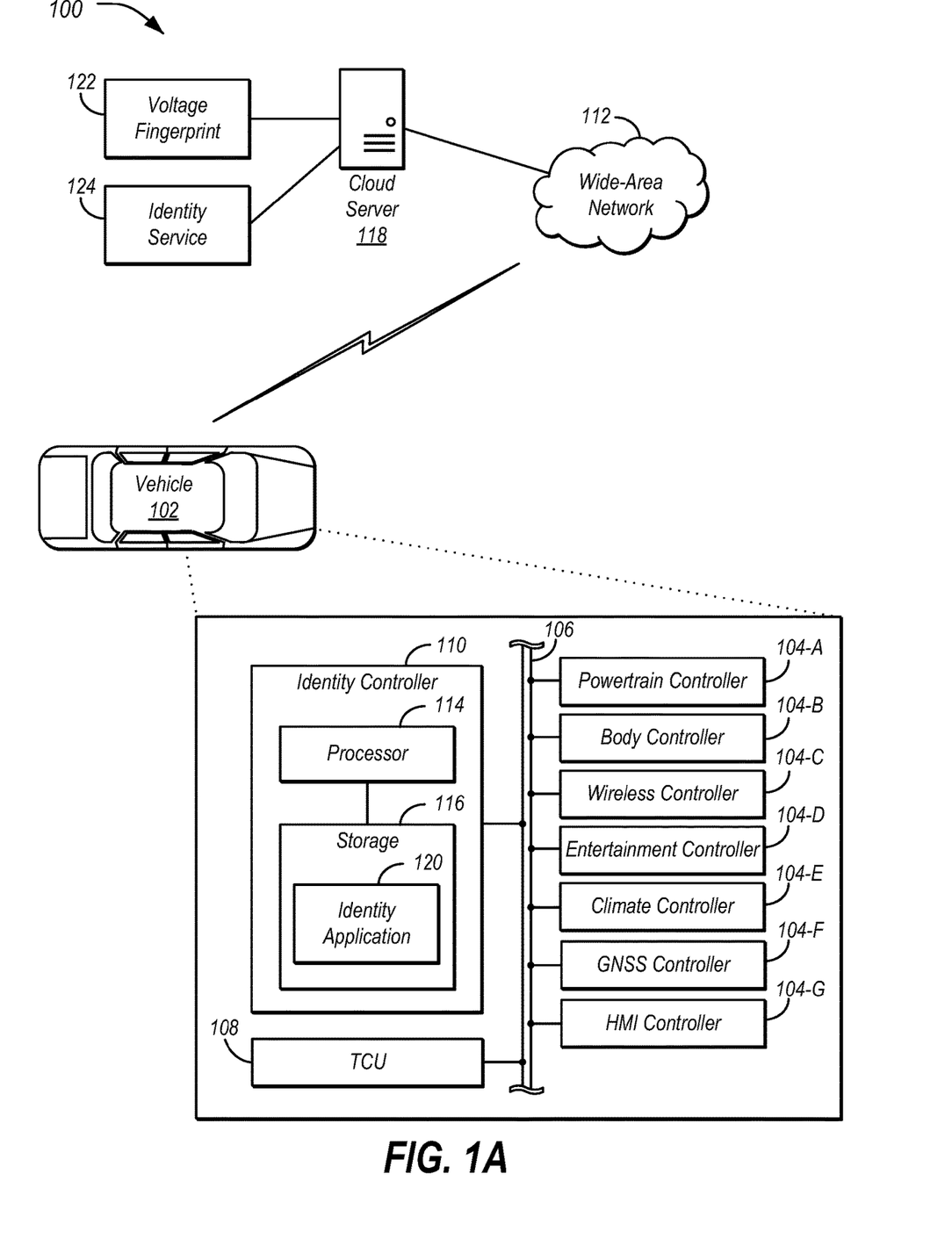
FIG. 1A illustrates an example system for the generation and use of voltage fingerprints for the identification of vehicles.

FIG. 1A illustrates an example system 100 for the generation and use of voltage fingerprints 122 for the identification of vehicles 102. As illustrated, the vehicles 102 include a plurality of vehicle electronic control units (ECUs) or vehicle controllers 104 in communication over one or more vehicle buses 106. The system 100 also includes a cloud server 118 configured to maintain voltage fingerprints 122. The vehicles 102 further include a telematics control unit (TCU) 108 configured to send voltage fingerprints 122 to the cloud server 118 for storage. The cloud server 118 executes an identity service 124 to utilize the vehicle fingerprints 122 to confirm the identities of the vehicles 102 of the system 100.

The vehicle 102 may include various types of automobile, crossover utility vehicle (CUV), sport utility vehicle (SUV), truck, recreational vehicle (RV), boat, plane or other mobile machine for transporting people or goods. In many cases, the vehicle 102 may be powered by an internal combustion engine. As another possibility, the vehicle 102 may be a hybrid electric vehicle (HEV) powered by both an internal combustion engine and one or more electric motors, such as a series hybrid electric vehicle (SHEV), a parallel hybrid electrical vehicle (PHEV), or a parallel/series hybrid electric vehicle (PSHEV). As the type and configuration of vehicle 102 may vary, the capabilities of the vehicle 102 may correspondingly vary. As some other possibilities, vehicles 102 may have different capabilities with respect to passenger capacity, towing ability and capacity, and storage volume. For title, inventory, and other purposes, vehicles 102 may be associated with unique identifiers, such as VINs.

The vehicle 102 may include a plurality of controllers 104 configured to perform and manage various vehicle 102 functions under the power of the vehicle battery and/or drivetrain. As depicted, the example vehicle controllers 104 are represented as discrete controllers 104-A through 104-G. However, the vehicle controllers 104 may share physical hardware, firmware, and/or software, such that the functionality from multiple controllers 104 may be integrated into a single controller 104, and that the functionality of various such controllers 104 may be distributed across a plurality of controllers 104.

As some non-limiting vehicle controller 104 examples: a powertrain controller 104-A may be configured to provide control of engine operating components (e.g., idle control components, fuel delivery components, emissions control components, etc.) and for monitoring status of such engine operating components (e.g., status of engine codes); a body controller 104-B may be configured to manage various power control functions such as exterior lighting, interior lighting, keyless entry, remote start, and point of access status verification (e.g., closure status of the hood, doors and/or trunk of the vehicle 102); a DSRC transceiver controller 104-C may be configured to communicate with key fobs, mobile devices, or other local vehicle 102 devices; an entertainment controller 104-D may be configured to support voice command and BLUETOOTH interfaces with the driver and driver carry-on devices; a climate control management controller 104-E may be configured to provide control of heating and cooling system components (e.g., compressor clutch, blower fan, temperature sensors, etc.); a global navigation satellite system (GNSS) controller 104-F may be configured to provide vehicle location information; and a human-machine interface (HMI) controller 104-G may be configured to receive user input via various buttons or other controls, as well as provide vehicle status information to a driver, such as fuel level information, engine operating temperature information, and current location of the vehicle 102.

The vehicle bus 106 may include various methods of communication available between the vehicle electronic control units (ECUs) 104, as well as between the TCU 108 and the vehicle ECUs 104. As some non-limiting examples, the vehicle bus 106 may include one or more of a vehicle controller area network (CAN), an Ethernet network, and a media-oriented system transfer (MOST) network. Further aspects of the layout and number of vehicle buses 106 are discussed in further detail below.

The TCU 108 may include network hardware configured to facilitate communication between the vehicle ECUs 104 and with other devices of the system 100. For example, the TCU 108 may include or otherwise access a cellular modem configured to facilitate communication with a wide-area network 112. The wide-area network 112 may include one or more interconnected communication networks such as the Internet, a cable television distribution network, a satellite link network, a local area network, and a telephone network, as some non-limiting examples. As another example, the TCU 108 may utilize one or more of BLUETOOTH, Wi-Fi, or wired USB network connectivity to facilitate communication with the wide-area network 112 via the user's mobile device.

An identity controller 110 may include various types of computing apparatus in support of performance of the functions of the identity controller 110 described herein. In an example, the identity controller 110 may include one or more processors 114 configured to execute computer instructions of an identity application 120, and a storage 116 medium on which the computer-executable instructions and/or data may be maintained. A computer-readable storage medium (also referred to as a processor-readable medium or storage 116) includes any non-transitory (e.g., tangible) medium that participates in providing data (e.g., instructions) that may be read by a computer (e.g., by the processor(s)). In general, the processor 114 receives instructions and/or data, e.g., from the storage 116, etc., to a memory and executes the instructions using the data, thereby performing one or more processes, including one or more of the processes described herein. Computer-executable instructions may be compiled or interpreted from computer programs created using a variety of programming languages and/or technologies, including, without limitation, and either alone or in combination, JAVA, C, C++, C #, FORTRAN, PASCAL, VISUAL BASIC, PYTHON, JAVA SCRIPT, PERL, PL/SQL, etc.

The identity controller 110 may be configured to include one or more interfaces from which vehicle information may be sent and received. In an example, the identity controller 110 may be configured to collect information from the vehicle controllers 104 connected to the one or more vehicle buses 106. While only a single bus 106 is illustrated, it should be noted that in many examples multiple vehicle buses 106 are included, with a subset of the controllers 104 connected to each bus 106.

While the identity controller 110 is shown in the system 100 as a dedicated controller, in other examples, the functionality of the identity controller 110 may be performed by the identity application 120 but executed by one of the other controllers 104 of the vehicle. For instance, the functionality of the identity controller 110 may be performed by the TCU 108 of the vehicle 102. As another example, the functionality of the identity controller 110 may be implemented by a component separate from the vehicle 102, such as an OBD-II dongle connected to a diagnostic port of the vehicle 102, a cellphone or other mobile device in communication with the dongle, or a remote server, such as the cloud server 118, receiving the bus data information from the dongle.

The cloud server 118 may include various types of computing apparatus, such as a computer workstation, a server, a desktop computer, a virtual server instance executed by a mainframe server, or some other computing system and/or device. Similar to the TCU 108, the cloud server 118 generally includes a memory on which computer-executable instructions may be maintained, where the instructions may be executable by one or more processors (not shown for clarity). Such instructions and other data may be stored using a variety of computer-readable media. In a non-limiting example, the cloud server 118 may be configured to maintain the voltage fingerprints 122 and the identity service 124.

The voltage fingerprint 122 may refer to a processed unique identifier created from a collection of voltage data captured over the vehicle bus 106 from the controllers 104 of the vehicle 102. Each controller 104 in the vehicle 102 that is connected to the vehicle bus 106 has different voltage characteristics due to the variations in the layer of transistors and resistors inside the controller 104. For example, these characteristics may include voltages and clock skews along the vehicle bus 106. Notably, these characteristics do not include the actual content of the data communications along the vehicle bus. These characteristics of the controllers 104 may be measured and used to construct unique voltage profiles, which may be used as the voltage fingerprint 122. For instance, voltages captured from CAN messages of multiple controllers 104 in the vehicle 102 may be used to build the voltage fingerprint 122 of the vehicle 102 hardware. Notably, as this fingerprint relates to the physical structure of the vehicle 102, the fingerprint is independent from the software state and survives a hard reset of the vehicle 102 electronics.

An identity service 124 may be an example of a software application installed to a memory (not shown) of the cloud server 118. When executed by one or more processors (not shown) of the cloud server 118, the identity service 124 may allow the cloud server 118 to identify vehicles 102 using the voltage fingerprints 122.

Figure 1B:
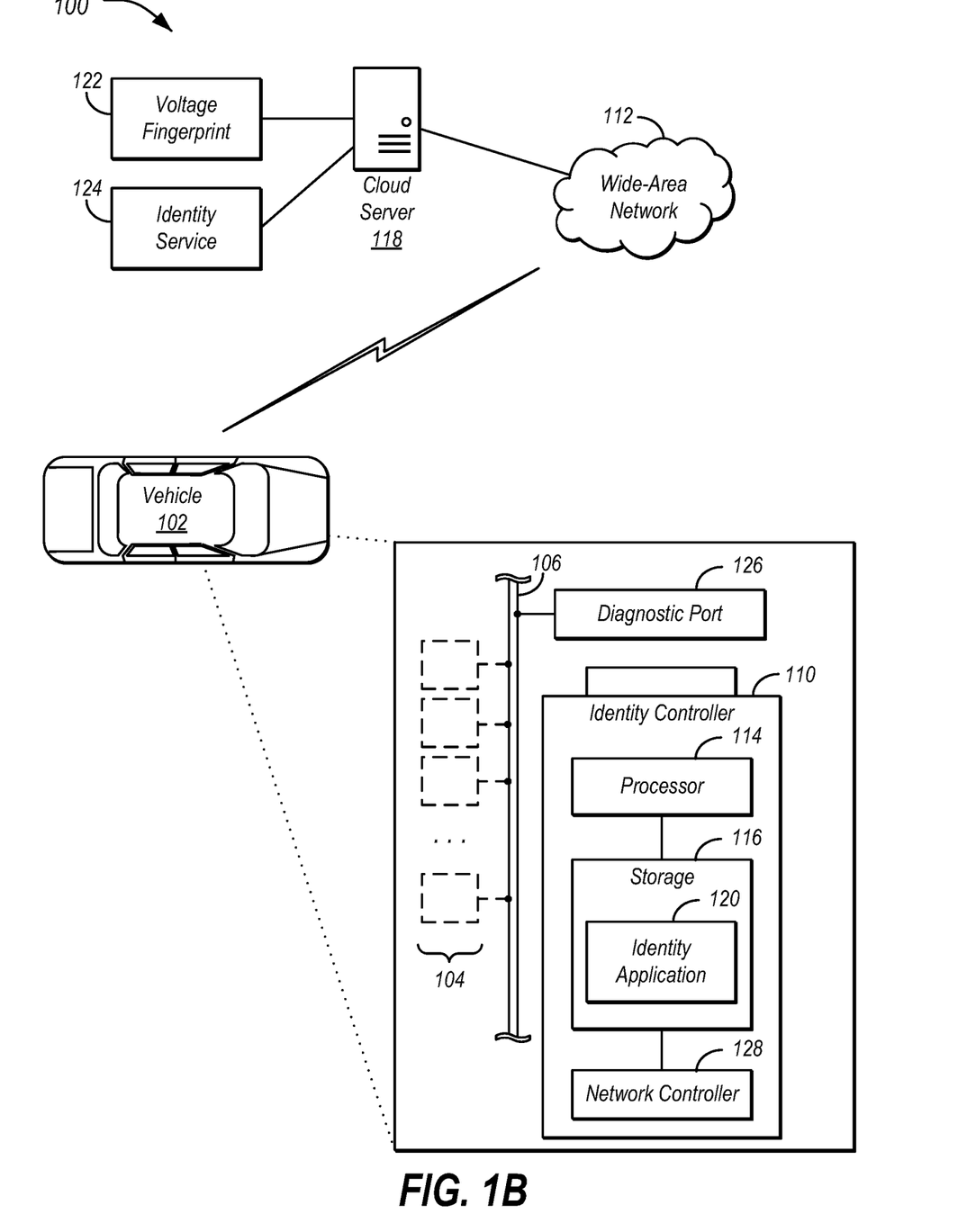
FIG. 1B illustrates an alternate example system for the generation and use of voltage fingerprints for the identification of vehicles.

FIG. 1B illustrates an alternate example system 100 for the generation and use of voltage fingerprints 122 for the identification of vehicles 102. As compared to the system 100 shown in FIG. 1A, the system 100 in FIG. 1B includes the identity controller 110 as a dongle that plugs into a diagnostic port 126 (such as an OBD-II port) of the vehicle 102. Additionally, in the alternate example system 100, the dongle uses a network controller 128 as opposed to the TCU 108 to communicate with the cloud server 118.

Figure 2:
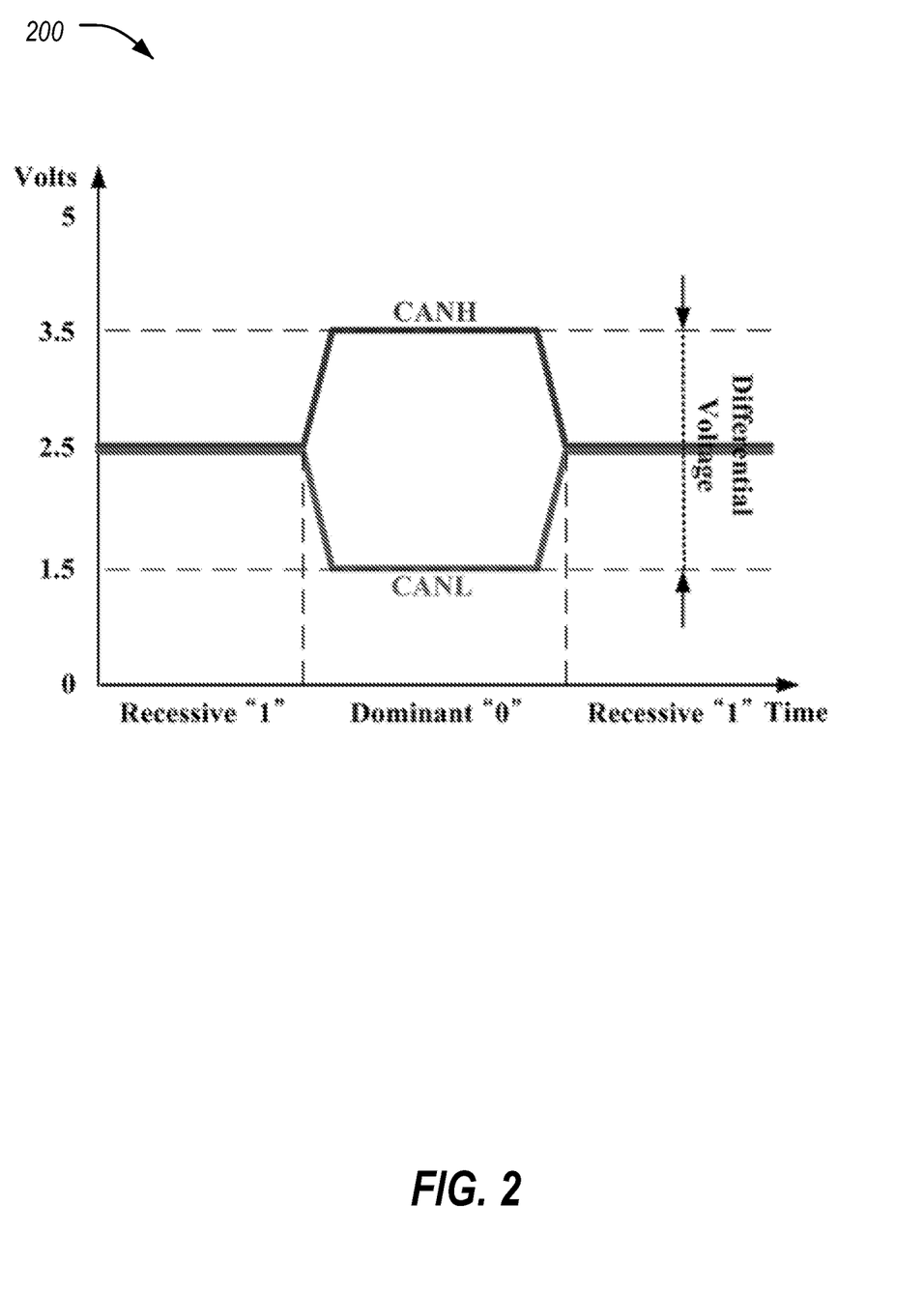
FIG. 2 illustrates an example of physical voltages sent over a vehicle bus.

FIG. 2 illustrates an example 200 of physical voltages sent over a vehicle bus 106. In the case of a vehicle 102 including a CAN vehicle bus 106 as shown, if the controller 104 sends a bit over the bus 106 to another controller 104, the CAN transceiver of the sender controller 104 generates a voltage signal which is CANH 3.5V and CANL 1.5V when a bit is "Dominant bit 0" or CANH 2.5V and CANL 2.5V when a bit is "Recessive bit 1." These voltages may be collected along the wires of the vehicle bus 106, and may be maintained as a representation of voltage over time, such as in a time line structure. Based on a capture of these voltages from a plurality of controllers 104 of the vehicle 102, the voltage profile may be generated. These voltage profiles may be manipulated into a voltage fingerprint 122. This voltage fingerprint 122 may then be used as a vehicle identifier.

Figure 3:
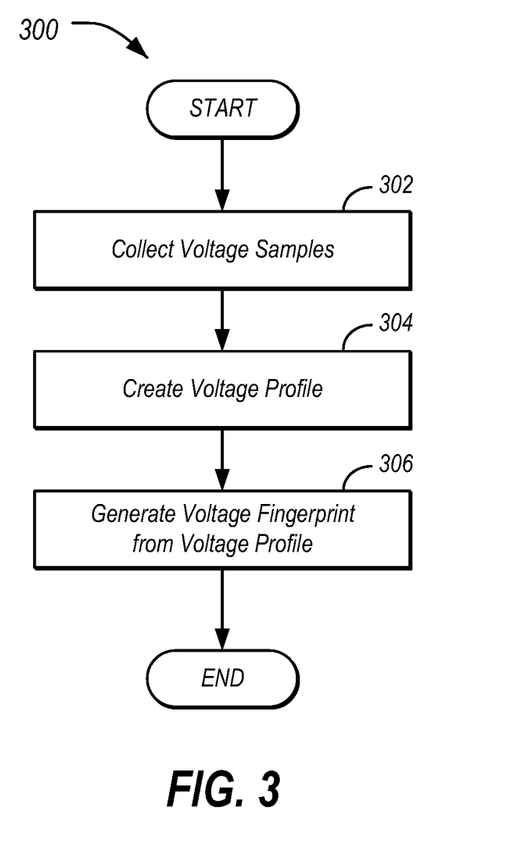
FIG. 3 illustrates an example process for the generation of voltage fingerprints from voltage data captures over the vehicle bus.

FIG. 3 illustrates an example process 300 for the generation of voltage fingerprints 122 from voltage data captures over the vehicle bus 106. In an example, the process 300 may be performed by the identity application 120 executed by the processor 114 of the identity controller 110.

At operation 302, the identity controller 110 collects voltage samples. In an example using CAN, the identity controller 110 measures the CANH (CAN high) and CANL (CAN low) voltages from the vehicle bus 106 and maps the acquired values to the corresponding controller 104 IDs of the CAN message it has just received through the receive buffer of the identity controller 110. The identity controller 110 also collects voltages from the CANH and the CANL during a predefined period of time to capture a training set to use to generate voltage profiles for each of the measured controllers 104 on the vehicle bus 106.

At 304, the identity controller 110 uses the voltage instances collected at operation 302 to create a voltage profile. The voltage profile may include voltage information indicative of CANH and CANL indexed by unique identifier (e.g., CAN ID) of controllers on the vehicle bus 106 (e.g., the CAN bus). The identity controller 110 may accumulate these measured voltages and generate projected lines to represent ID mapped voltage profiles by linear regression or projection methods. Accordingly, the voltage data for each measured controller 104 may be used to define a unique line with a different direction along the time axis.

Figure 4:
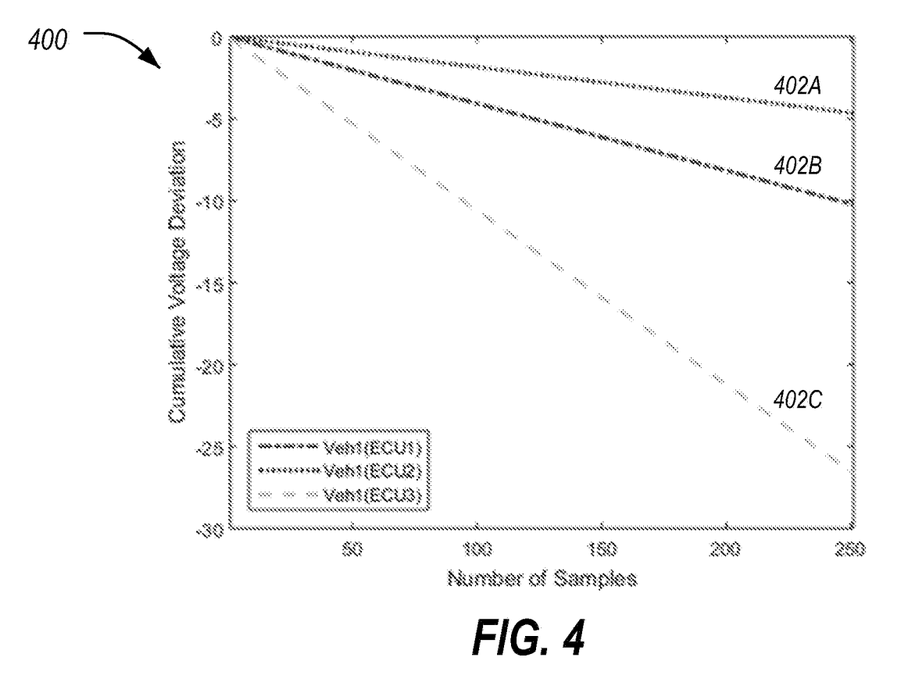
FIG. 4 illustrates an example of generation of projected lines using cumulative voltage deviation for a set of controllers of a first vehicle.

FIG. 4 illustrates an example 400 of generation of projected lines 402 using cumulative voltage deviation for a set of controllers 104 of a first vehicle 102. As shown, a first projected line 402A is illustrated for a first controller 104 of the first vehicle 102, a second projected line 402B is illustrated for a second controller 104 of the first vehicle 102, and a third projected line 402C is illustrated for a third controller 104 of the first vehicle 102. These projected lines 402 are illustrated in an X-axis defined as a number of samples of collected data. Additionally, these projected lines 402 are illustrated with a Y-axis defined as a cumulative voltage deviation from a standard measurement.

Figure 5:
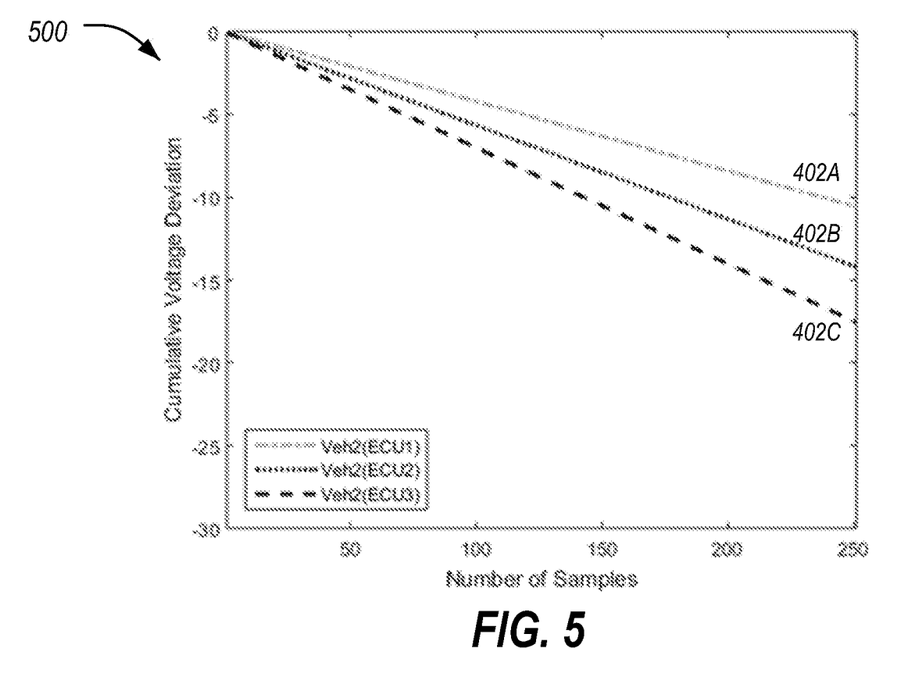
FIG. 5 illustrates an example of generation of projected lines using cumulative voltage deviation for a set of controllers of a second vehicle.

FIG. 5 illustrates an example 500 of generation of projected lines 402 using cumulative voltage deviation for a set of controllers 104 of a second vehicle 102. As shown, a first projected line 402A is illustrated for a first controller 104 of the second vehicle 102, a second projected line 402B is illustrated for a second controller 104 of the second vehicle 102, and a third projected line 402C is illustrated for a third controller 104 of the second vehicle 102.

Referring back to FIG. 3, at operation 306, the identity controller 110 collects all of the controller 104 IDs and corresponding projected lines 402 with different directions for the vehicle 102. For instance, the data may include a controller 104 ID and corresponding parameters of the linear regression or projection (e.g., the values m and b for a line defined by the equation y=mx+b). This collection of data is the voltage fingerprint 122 and represents a unique identifier of the vehicle 102. This unique identifier is different for each vehicle 102. After operation 306, the process 300 ends.

Figure 6:
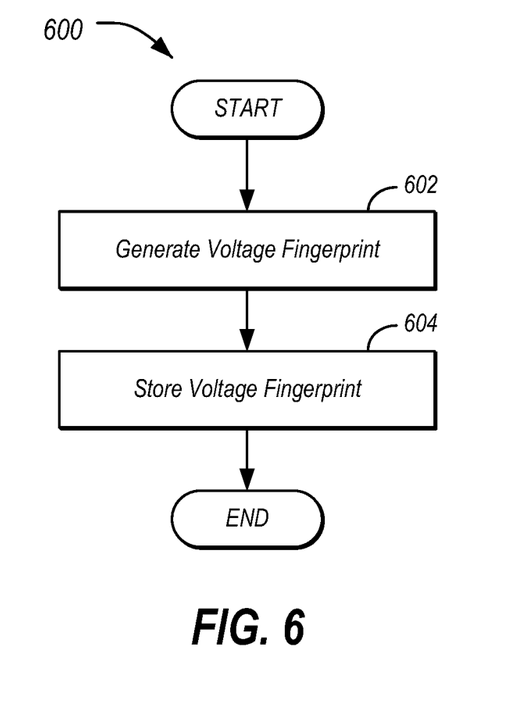
FIG. 6 illustrates an example process for the storage of voltage fingerprints.

FIG. 6 illustrates an example process 600 for the storage of voltage fingerprints 122. In an example, the process 600 may be performed by the identity application 120 executed by the processor 114 of the identity controller 110. At 602, the identity controller 110 generates a voltage fingerprint 122. In an example, the voltage fingerprint 122 may be generated as discussed in detail above with respect to the process 300. At operation 604, the identity controller 110 stores the voltage fingerprint 122 generated at operation 602. In an example, the voltage fingerprint 122 may be stored to the identity controller 110. In another example, the voltage fingerprint 122 may be uploaded to the cloud server 118 for storage. After operation 604, the process 600 ends.

Figure 7:
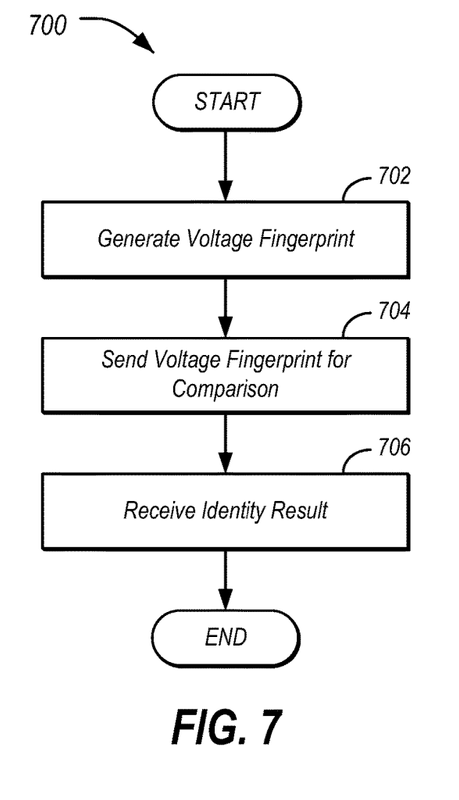
FIG. 7 illustrates an example process for the determination of vehicle identity using a voltage fingerprint.

FIG. 7 illustrates an example process 700 for the determination of vehicle 102 identity using a voltage fingerprint 122. In an example, the process 700 may be performed by the identity application 120 executed by the processor 114 of the identity controller 110.

Figure 8:
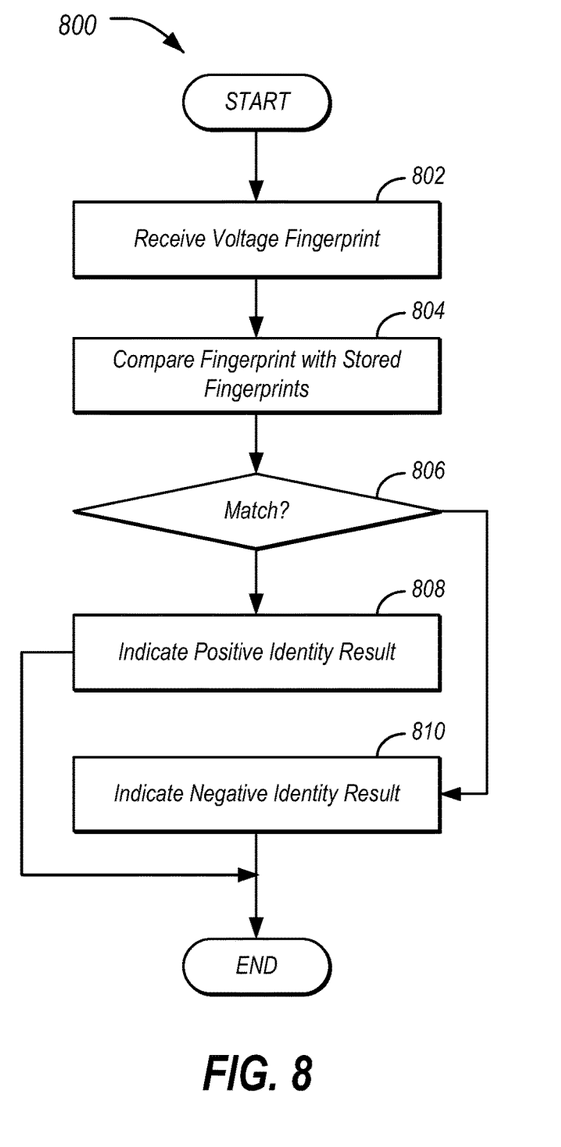
FIG. 8 illustrates an example process for the matching of vehicle fingerprints.

At 702, the identity controller 110 generates a voltage fingerprint 122. In an example, the voltage fingerprint 122 may be generated as discussed in detail above with respect to the process 300. At operation 704, the identity controller 110 sends the voltage fingerprint 122 generated at operation 702 for comparison. In an example, the voltage fingerprint 122 may be sent from the identity controller 110 to the TCU 108 for transport over the wide-area network 112 to the cloud server 118 for comparison by the identity service 124 with voltage fingerprints 122 stored to the cloud server 118. Further aspects of the identity comparison are described in the process 800.

At operation 706, the identity controller 110 receives an identity result responsive to the sending of the voltage fingerprint 122 at operation 704. In an example, the identity result may indicate that the vehicle 102 is recognized. In another example, the identity result may indicate that the vehicle 102 is authorized or is not authorized to perform some action. In yet a further example, a name, user credential, user setting(s), or other information corresponding to the vehicle 102 may be returned responsive to the request. In an example, the identity result may be returned to the identity controller 110 by the TCU 108 responsive to receipt of the identity result over the wide-area network 112 from the cloud server 118. After operation 706, the process 700 ends.

FIG. 8 illustrates an example process 800 for the matching of vehicle fingerprints 122. In an example, the process 800 may be performed by the identity service 124 executed by the processor 114 of the cloud server 118.

At operation 802, the cloud server 118 receives a voltage fingerprint 122. In an example, the received voltage fingerprint 122 may have been sent as described at operation 702 of the process 700. At 804, the cloud server 118 compares the received voltage fingerprint 122 with voltage fingerprints 122 stored to the cloud server 118. In an example, the stored voltage fingerprint 122 may have been received and stored to the cloud server 118 responsive to the process 600 described in detail above.

The cloud server 118 determines whether the voltage fingerprint 122 is a match at 806. To determine a match, the identity service 124 may compare the slopes of the projected lines 402 for corresponding controller 104 IDs of the received voltage fingerprint 122 to identify which of the stored voltage fingerprints 122 is an exact match, (or in some cases a best match if there is no exact match). If a match is found, control passes to operation 808. If not, control passes to operation 810.

At 808, the cloud server 118 indicates a positive identity result. In an example, similar to as discussed at operation 706, the identity result may indicate that the vehicle 102 is recognized. In another example, the identity result may indicate that the vehicle 102 is authorized to perform some action. In yet a further example, a name, user credential, user setting(s), or other information corresponding to the vehicle 102 may be returned responsive to the request. In an example, the identity result may be returned over the wide-area network 112. In an example, the identity result may be returned to the identity controller 110 as described at operation 706 of the process 700. After operation 808, the process 800 ends.

At operation 810, the cloud server 118 indicates a negative identity result. In an example, similar to as discussed at operation 706, the identity result may indicate that the vehicle 102 is not recognized. In another example, the identity result may indicate that the vehicle 102 is not authorized to perform some action. In yet a further example, a name, user credential, user setting(s), or other information corresponding to the vehicle 102 may not be determined or returned responsive to the request. After operation 810, the process 800 ends.

Computing devices described herein generally include computer-executable instructions where the instructions may be executable by one or more computing devices such as those listed above. Computer-executable instructions may be compiled or interpreted from computer programs created using a variety of programming languages and/or technologies, including, without limitation, and either alone or in combination, JAVA™, C, C++, C #, VISUAL BASIC, JAVASCRIPT, PYTHON, JAVASCRIPT, PERL, PL/SQL, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The abstract of the disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A system comprising:
a vehicle bus, of a vehicle, configured to provide data communication among a plurality of controllers of the vehicle; and
an identity controller, of the vehicle, programmed to
collect voltage samples over the vehicle bus from the plurality of controllers to create a voltage profile indicating consistent electrical aspects of the data communication between the plurality of controllers, the electrical aspects being independent of data content of the data communication, the electrical aspects including voltage samples of the data communication indicative of low and high signals over the vehicle bus,
for each of the plurality of controllers to compute the consistent electrical aspects, accumulate the voltage samples over time to identify values specifying a projected line defining a cumulative voltage deviation of the voltage samples over time,
generate a voltage fingerprint uniquely identifying the vehicle using the voltage profile, and
send the voltage fingerprint to a remote device for storage as a unique identifier of the vehicle.

2. The system of claim 1, wherein the projected line is generated by linear regression.

3. The system of claim 1, wherein the remote device is a cloud server.

4. The system of claim 1, wherein the identity controller is further programmed to receive an identity result from a cloud server responsive to sending the voltage fingerprint to the cloud server for comparison.

5. The system of claim 4, wherein the identity result indicates whether the vehicle is recognized based on the voltage fingerprint.

6. The system of claim 1, wherein the vehicle bus is a controller area network (CAN) bus, and the voltage samples include information indicative of CANH and CANL signals over the CAN bus.

7. A method comprising:
receiving a test voltage fingerprint from a vehicle, the test voltage fingerprint being created by the vehicle and uniquely identifying the vehicle from electrical aspects of data communication over a vehicle bus between a plurality of controllers of the vehicle independent of content of the data communication, the electrical aspects including voltage samples of the data communication indicative of low and high signals over the vehicle bus, wherein the test voltage fingerprint includes data for each of the plurality of controllers representing a cumulative voltage deviation of the voltage samples for the corresponding controller over time;
comparing the test voltage fingerprint with stored voltage fingerprints to identify a match by comparing cumulative voltage deviations of the test voltage fingerprint with cumulative voltage deviations of the stored voltage fingerprints, wherein the test voltage fingerprint includes data for each of the plurality of controllers indicative of a projected line representing a cumulative voltage deviation of voltage samples for the corresponding controller over time, and further comprising comparing the test voltage fingerprint with the stored voltage fingerprints to identify the match by comparing the projected lines of the test voltage fingerprint with projected lines of the stored voltage fingerprints;
if the match is found, indicate a positive identity result to the vehicle; and
otherwise, indicate a negative identity result to the vehicle.

8. The method of claim 7, further comprising:
receiving a first voltage fingerprint from the vehicle;
storing the first voltage fingerprint as one of the stored voltage fingerprints in a memory;
receiving a second voltage fingerprint from a second vehicle;
storing the second voltage fingerprint as one of the stored voltage fingerprints in the memory; and
comparing the test voltage fingerprint with the stored voltage fingerprints to identify one of the first voltage fingerprint or the second voltage fingerprint as the match.

9. The method of claim 7, wherein the electrical aspects of the data communication include voltages and clock skews of the data communication along a vehicle bus.

10. The method of claim 7, wherein the positive identity result indicates that the vehicle is authorized, and the negative identity result indicates that the vehicle is not authorized.

11. The method of claim 7, wherein the positive identity result indicates that the vehicle is successfully identified, and the negative identity result indicates that the vehicle is unsuccessfully identified.

12. A system comprising:
a storage maintaining a plurality of voltage fingerprints, each voltage fingerprint being created by a different vehicle and including data uniquely identifying the different vehicle from electrical aspects of data communication over a vehicle bus between a plurality of controllers of the respective vehicle, independent of data content of the data communication, the electrical aspects including voltage samples of the data communication indicative of low and high signals over the vehicle bus, the data including, for each of the plurality of controllers of the respective vehicle, a cumulative voltage deviation of voltage samples for the corresponding controller over time; and
a processor programmed to
receive a test voltage fingerprint from a test vehicle, the test voltage fingerprint being created by the test vehicle and including data for each of the plurality of controllers of the test vehicle representing a cumulative voltage deviation of voltage samples for the corresponding controller of the test vehicle over time,
compare the test voltage fingerprint with the plurality of voltage fingerprints to identify a match by comparing the cumulative voltage deviations of the test voltage profile with the cumulative voltage deviations of the plurality of voltage fingerprints, and indicate to the test vehicle an identity result responsive to whether the match for the test voltage fingerprint was found in the storage,
wherein the voltage fingerprint includes data for each of the plurality of controllers indicative of a projected line representing a cumulative voltage deviation of voltage samples for the corresponding controller over time, and the processor is further programmed to compare the voltage fingerprint with the plurality of voltage fingerprints to identify the match by comparing the projected lines of the test voltage profile with projected lines of the plurality of voltage fingerprints.

13. The system of claim 12, wherein the processor is further programmed to:
receive a first voltage fingerprint from the test vehicle;
store the first voltage fingerprint as one of the plurality of voltage fingerprints in a memory;
receive a second voltage fingerprint from a second vehicle;
store the second voltage fingerprint as one of the plurality of voltage fingerprints in the memory; and
compare the test voltage fingerprint with the stored voltage fingerprints to identify one of the first voltage fingerprint or the second voltage fingerprint as the match.

14. The system of claim 12, wherein the electrical aspects of the data communication include voltages and clock skews of the data communication along a vehicle bus.

15. The system of claim 12, wherein the identity result indicates whether or not the test vehicle is authorized.

16. The system of claim 12, wherein the identity result indicates whether or not the test vehicle is successfully identified.

* * * * *